United States Patent [19]

Jain et al.

[11] Patent Number: 4,948,757
[45] Date of Patent: Aug. 14, 1990

[54] METHOD FOR FABRICATING THREE-DIMENSIONAL MICROSTRUCTURES AND A HIGH-SENSITIVITY INTEGRATED VIBRATION SENSOR USING SUCH MICROSTRUCTURES

[75] Inventors: Kailash C. Jain, Sterling Heights, Mich.; Jacob A. Abraham, Austin, Tex.

[73] Assignee: General Motors Corporation, Detroit, Mich.

[21] Appl. No.: 307,930

[22] Filed: Feb. 9, 1989

Related U.S. Application Data

[63] Continuation-in-part of Ser. No. 37,581, Apr. 13, 1987, abandoned.

[51] Int. Cl.$^5$ .................. H01L 21/302; H01L 21/311
[52] U.S. Cl. ................................... 437/240; 437/225; 437/238; 148/DIG. 51; 156/657
[58] Field of Search ............... 437/228, 225, 238, 239, 437/240, 40, 233, 241; 156/653, 657; 357/25, 26; 148/DIG. 51, DIG. 159; 252/79.1, 79.2

[56] References Cited

U.S. PATENT DOCUMENTS

| | | | |
|---|---|---|---|
| 3,328,649 | 6/1967 | Rindner et al. | |
| 3,764,820 | 10/1973 | White et al. | 307/121 |
| 4,264,374 | 4/1981 | Beyer et al. | 134/3 |
| 4,478,077 | 10/1984 | Bohrer et al. | 73/204 |
| 4,571,661 | 2/1986 | Hoshino | 361/283 |
| 4,597,003 | 6/1986 | Aine et al. | 357/26 |
| 4,665,610 | 5/1987 | Barth | 29/580 |
| 4,670,092 | 6/1987 | Motamedi | 156/643 |
| 4,706,374 | 11/1987 | Murakami | 437/225 |

FOREIGN PATENT DOCUMENTS 105332 2/1980 Japan .
74682 4/1984 Japan .

OTHER PUBLICATIONS

Petersen, K. E., "Silicon as a Mechanical Material", *Proceedings of the IEEE*, vol. 70, No. 5, pp. 420-457, May 1982.

Kern, W. and Puotinen, D. C., "Cleaning Solutions Based on Hydrogen Peroxide for Use in Silicon Semiconductor Technology", *RCA Review*, pp. 187-205, Jun. 1970.

Petersen, K. E., Shartel, A. and Raley, N. F., "Micromechanical Accelerometer Integrated with MOS Detection Circuitry", *IEEE Transactions on Electron Devices*, vol. ED-29, No. 1, pp. 23-26, Jan. 1982.

Kern, W., "Purifying Si and SiO$_2$ Surfaces with Hydrogen Peroxide", *Semiconductor International*, pp. 94-99, Apr. 1984.

(List continued on next page.)

Primary Examiner—Brian E. Hearn
Assistant Examiner—Kevin McAndrews
Attorney, Agent, or Firm—Robert J. Wallace

[57] ABSTRACT

A method for preferentially etching phosphosilicate glass to form a micromechanical structure includes forming a layer of phosphosilicate glass on a substrate and opening at least one via in the phosphosilicate glass layer. A layer of material which is patterned to produce a micromechanical structure is formed over the phosphosilicate glass layer which extends through the via and adheres to the substrate. The phosphosilicate glass layer is then removed by immersing the device in an etchant bath containing an aqueous ammoniacal hydrogen peroxide solution. The resulting micromechanical structure has at least one point of attachment to the substrate and is otherwise spaced apart from the substrate by an air gap. A method for attaching an overhanging mass to a miniature cantilever beam using microelectronics fabrication technology is also provided in which the center of gravity is shifted to the endpoint of the free end of the beam. There is further provided an integrated sensor which includes at least one micromechanical transducing structure and on-board detection circuitry which detects extremely small motions of the structure and produces a corresponding digital output.

4 Claims, 5 Drawing Sheets

OTHER PUBLICATIONS

Frobenius, W. D. et al., "Microminiature Ganged Threshold Accelerometers Compatible with Integrated Circuit Technology", *IEEE Transactions on Electron Devices*, vol. ED-19, No. 1, pp. 37-40, Jan. 1972.

Roylance, L. M. and Angell, J. B., "A Batch-Fabricated Silicon Accelerometer", *Transactions on Electron Devices*, vol. ED-26, No. 12, pp. 1911-1917, Dec. 1979.

Watanabe et al., "Etching . . . Process", *Proceeding Electrochemical Society*, 1983, pp. 488-496.

White, L. K., "Bilayer Taper Etching of Field Oxides and Passivation Layers", *Journal of Electrochemical Society: Solid State Science and Technology*, vol. 127, No. 12, pp. 2687-2693 (Dec. 1980).

Kern, W., "Densification of Vapor-Deposited Phosphosilicate Glass Films", *RCA Review*, vol. 37, pp. 55-77 (Mar. 1976).

METHOD FOR FABRICATING THREE-DIMENSIONAL MICROSTRUCTURES AND A HIGH-SENSITIVITY INTEGRATED VIBRATION SENSOR USING SUCH MICROSTRUCTURES

RELATED PATENT APPLICATIONS

This patent application is a continuation-in-part of U.S. patent application Ser. No. 037,581, now abandoned, which has the same title as this patent application and was filed Apr. 13, 1987. U.S. patent application Ser. No. 222,119 was filed July 8, 1988, as a division of U.S. Ser. No. 037,581.

FIELD OF THE INVENTION

The present invention deals generally with micromechanical structures which function as transducing elements in semiconductor devices. More particularly, the present invention relates to methods for fabricating these three-dimensional microstructures and to vibration sensors in which these microstructures are utilized.

BACKGROUND OF THE INVENTION

Materials which have traditionally been used in microelectronic devices due to their electrical properties have recently been utilized to form mechanical structures. Techniques for micromachining these materials to produce miniature three-dimensional mechanical structures, such as cantilever beams, trestles, pedestals and other similar structures, have been developed. Hence, it is now possible to fabricate micromechanical structures on silicon chips which respond to inertial and other forces.

These micromechanical structures have been used as transducing elements to "sense" vibration and acceleration. In these devices, a micromechanical structure, such as a cantilever beam, is formed such that it responds to an applied force. For example, a cantilever beam can be formed which deflects in response to a force applied normal to its principal surface. The direction and magnitude of a force applied to the beam is proportional to the beam deflection. Thus, micromechanical structures can be fabricated which are excellent transducing elements for vibration sensors and accelerometers. Micromechanical transducing elements can be rapidly and reliably mass-produced using batch fabrication techniques adapted from microelectronics technology. The quality of the cantilever beam or other transducing element is critical to the performance of the sensor.

In order to provide greater packing density and to reduce parasitic capacitances which may interfere with signal transmission, many vibration sensors and accelerometers are designed such that the micromechanical transducing element and the detection circuitry are provided on a single chip. Since the magnitude of deflection of the micromechanical structure is very small, it is essential that parasitic capacitances be kept to an absolute minimum so that they do not overwhelm the signal generated by the transducing element. By integrating electrical and mechanical components in a single silicon body to produce a "smart sensor," parasitic capacitances can be substantially reduced.

In the past, solid-state accelerometers and vibration sensors were based primarily on the piezo-resistive effect. Piezo-resistive sensors relate a stress-induced change in resistivity of a diffused resistor to the magnitude of the stress-producing force. Other solid-state accelerometers utilize changes in the electrical characteristics of a pn junction when stressed. In general, however, piezo-effect devices are only accurate when measuring extremely large stresses. Moreover, when these devices are highly stressed, the materials of which they are formed often fracture under the strain. Other known accelerometers include cantilever beams which function in the nature of electromechanical switches. The beams deflect in response to accelerations, but the beam movement is used only to close or open an electrical contact, much like a mechanical switch. Some of these mechanical, switch-like devices have an array of cantilever beams. Each beam is weighted or "loaded" to respond to an incrementally greater acceleration by virtue of a greater inertial mass. These devices are capable of measuring a range of acceleration thresholds.

Sensors have also been devised which include a cantilever beam or other transducing element which is integrated with metal oxide semiconductor (MOS) detection circuitry in a single chip. In these smart sensors, accelerations of the chip induce motions in the beam that produce capacitance variation which drive the detection circuitry. The changes in capacitance are extremely small, and the signal so produced is thus susceptible to being overwhelmed by parasitic capacitances. As mentioned above, parasitic capacitances are most easily reduced by placing the detection circuitry "on-board" with the micromechanical transducing element.

Conventional techniques for fabricating smart sensors having one or more micromechanical transducing elements, do not provide a convenient procedure for fabricating both the detection circuitry and the micromechanical structure. One acute problem with prior art techniques is that conventional chemical etchants used to undercut micromechanical structures, such as cantilever beams and the like, etch the pre-formed detection circuitry along with the micromechanical structure. Hence, the use of prior art chemical etchants, such as hydrofluoric acid and ethylenediamine pyrocatechol, requires that the detection circuitry be protected by complicated masking techniques during formation of the micromechanical structures. It would, therefore, be desirable to provide a process for fabricating three-dimensional structures, such as cantilever beams and trestles, which affords a high degree of selective etch control and which does not require complicated masking procedures to protect the detection circuitry. In U.S. patent application Ser. No. 836,900, now U.S. Pat. No. 4,652,334, filed Mar. 6, 1986, entitled, "Method for Patterning Silicon Dioxide With High Resolution in Three Dimensions," which is assigned to the assignee of the present invention, a method is disclosed in which an aqueous ammoniacal hydrogen peroxide solution is used to preferentially etch ion-damaged silicon dioxide. We have now discovered a method for producing micromechanical structures which utilizes an ammoniacal hydrogen peroxide solution as an etchant. We have also discovered three-dimensional microstructures for use as transducing elements in vibration sensors. We have further discovered a high-sensitivity integrated vibration sensor which uses standard MOS circuit components to measure extremely small motions of microstructures.

OBJECTS AND SUMMARY OF THE INVENTION

It is an object of the present invention to provide a reliable and convenient method for fabricating micromechanical structures.

It is a further object of the present invention to provide a method for preferentially etching phosphosilicate glass without substantially etching silicon, silicon dioxide and polysilicon.

It is a still further object of the present invention to provide a method for forming a cantilever beam having its center of gravity at the end point of the free end of the beam.

Another object of the present invention is to provide a method for measuring extremely small deflections of a beam or other micromechanical structure.

It is recognized that undensified phosphosilicate glass etches significantly more rapidly than densified phosphosilicate glass, silicon, silicon dioxide, or polysilicon. In accordance with this aspect of the invention, there is provided a method for preferentially etching a layer of phosphosilicate glass 100 to 1,000 times faster than underlying or surrounding layers of silicon, silicon dioxide, or polysilicon. The method includes depositing the phosphosilicate glass at a temperature less than about 400° C, so that, as deposited, it will be undensified and readily etchable by the selective etchant hereinafter described. The invention further includes depositing the added silicon, silicon dioxide, and/or polysilicon layers under conditions that will not subject the previously deposited undensified glass to temperatures greater than about 650° C. for more than about 2–4 hours. The invention still further includes contacting the undensified glass and other layers with an aqueous ammoniacal hydrogen peroxide solution to selectively remove the undensified phosphosilicate glass layer at a reasonably rapid rate without significantly etching the associated silicon, silicon dioxide, and/or polysilicon layers. In one embodiment, the novel etching method is used to fabricate a micromechanical structure.

According to the novel method, an undensified phosphosilicate glass layer is first deposited over a substrate. The substrate may include silicon, silicon dioxide, and polysilicon. One or more vias are formed in the undensified phosphosilicate glass layer to expose a portion of the underlying substrate. A polysilicon micromechanical structure is then formed overlying the undensified phosphosilicate glass layer and extending through the via in rigid attachment with the underlying substrate. Recognizing that undensified phosphosilicate glass can somewhat densify even at room temperature, if stored for more than a few weeks, we prefer to etch the undensified phosphosilicate glass reasonably promptly after all the associated layers are deposited. The undensified phosphosilicate glass layer is preferentially removed by etching in an aqueous ammoniacal hydrogen peroxide solution. The resulting micromechanical structure has an attachment point to the substrate at the location of each via, but is otherwise free to deflect toward or away from the substrate. In the preferred embodiment, the method of the present invention is used to form a micromechanical structure on a substrate on which defection circuitry has already been formed. Due to the selectivity of the etchant, a micromechanical structure can be formed without substantially etching the pre-formed circuitry.

In another aspect, the present invention provides a method for fabricating a loaded or massed micromechanical cantilever beam such that the center of gravity of the beam is located at the end point of the free end of the beam. According to this method, a fully formed cantilever beam is encased in a layer of photoresist through which an opening is made to expose a portion of the top or principal surface of the beam. A mass is then formed overlying the photoresist and extending through the opening in contact with the principal surface of the cantilever beam. The opening through the photoresist and the mass are formed such that the mass extends beyond the free end of the cantilever beam in an overhanging fashion. The photoresist is then removed with an oxygen plasma freeing the loaded beam. By placing the mass in overhanging relationship to the beam, the center of gravity of the structure can be placed at the end point of the free end of the beam, thereby eliminating its reverse moment.

The present invention further comprehends a vibration sensor having at least one cantilever beam which forms an integral part of a variable capacitor in a high frequency oscillator. Oscillation is stopped or started by an enable signal and, as the beam deflects, the change in capacitance changes the frequency of oscillation of the circuit. Small frequency changes are detected by feeding the output of the circuit into a high performance counter which is clocked by a high frequency reference clock. By enabling the counter for a long period of time compared to the period of the oscillator, very small frequency changes can be converted into a different count produced by the counter. The oscillator thus produces a digital output which is fed into a digital counter.

BRIEF DESCRIPTION OF THE DRAWINGS

Other objects, features and advantages of this invention will become more apparent from the following description of the preferred embodiments thereof and from the drawings, in which:

FIG. 14 is a schematic circuit of an oscillator having a frequency modulated by a variable capacitor in accordance with this invention.

FIG. 15 is a block diagram of an integrated detection system in accordance with the present invention.

FIG. 16 are graphs of outputs of the oscillator under various simulated accelerations.

DESCRIPTION OF THE PREFERRED EMBODIMENTS

Figure 1:
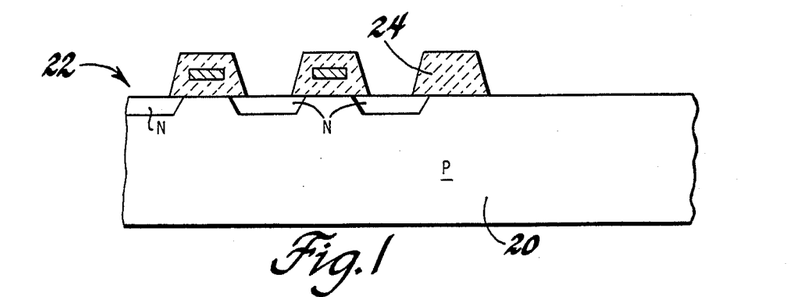
FIGS. 1 through 5 and FIG. 7 show cross-sectional views of a device in intermediate fabrication stages made in accordance with this invention.

Referring now to FIG. 1 of the drawings, substrate 20 has formed thereon detection circuitry 22 which is illustrated here as standard MOS circuit elements. By MOS circuit elements, we mean insulated gate field effect transistors and the like. Substrate 20 may include any material which resists etching in the etchant solution of the present invention, such as silicon, silicon dioxide, and polysilicon. By polysilicon we mean polycrystalline silicon. Detection circuitry 22 will also typically include one or more of these materials. As will be explained more fully hereinbelow, in some applications substrate 20 is formed of single-crystal silicon and serves as one plate, usually ground, of a variable capacitor. It is to be understood that the detection circuitry 22, as shown in FIG. 1, is fully fabricated but lacks an overlying metal interconnect layer. As will be described, the metal interconnect layer is formed subsequent to the formation of a micromechanical structure. Also, during the formation of detection circuitry 22, a pedestal 24 may be formed, preferably of silicon dioxide. In the embodiment of the invention, pedestal 24 will serve as the point of attachment by which the micromechanical structure is rigidly connected to substrate 20. In some applications, it may be desirable to attach the micromechanical structure directly to substrate 20. Although detection circuitry 22 is illustrated as including several MOS circuit elements, other well known detection circuitry may be suitable for use in the present invention.

Figure 2:
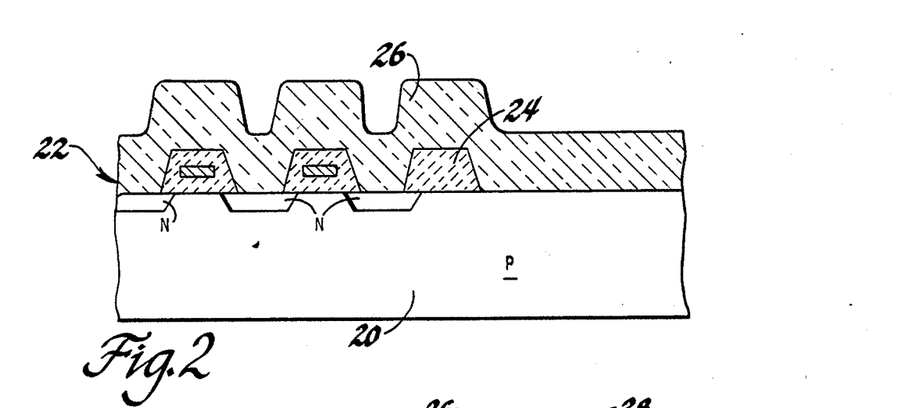

Referring now to FIG. 2, a layer of undensified phosphosilicate glass 26 is formed overlying substrate 20, detection circuitry 22 and pedestal 24. Undensified phosphosilicate glass layer 26 is suitably applied by spin-coating at room temperature or by chemical vapor deposition at a temperature of less than about 400° C. In order to obtain the rapid preferential etch of phosphosilicate layer 26, it must be deposited by a technique that will leave it undensified as deposited. By undensified, we mean that the glass contains small particles of $P_2O_5$ dispersed in the $SiO_2$ matrix (rather than a compound such as $2SiO_2.P_2O_5$ or $SiO_2.P_2O_5$). Also, that it is porous and the $SiO_2$ matrix has a large angular distribution width of Si—O—Si bonds.

In addition, the rapid preferential etch can only be obtained if the phosphosilicate glass is left undensified by any further processing conditions that it may be subjected to after it is deposited and before it is preferentially etched. Such treatments must not combine to subject the phosphosilicate glass to a total heat treatment equal to a temperature of over about 650° C. for about 2–4 hours. Storage at room temperature for extended periods of time (such as a few weeks, or a month or two) can even cause the phosphosilicate glass to densify. Accordingly, we prefer to etch the phosphosilicate glass as soon as is reasonably practical, as, for example, within a week after it is deposited. Then it will preferentially etch at a reasonably rapid rate of about 400R°/min. to 800° A/min. in our selective etchant. Heretofore, it was not known that the undensified phosphosilicate glass would etch so rapidly in this particular etchant, and thus provide a reasonably useful preferential etchant.

While it is essential to this invention that the phosphosilicate glass layer 26 be undensified when etched, it is also important that it should be of the proper composition. It is thus important that the phosphosilicate glass layer 26 contain from about 5.5 percent to about 8.0 percent by weight $P_2O_5$. It is most preferred that phosphosilicate glass layer 26 contain about 6.0 percent by weight $P_2O_5$. As the concentration of $P_2O_5$ decreases below 6.0 percent, the time required to etch phosphosilicate glass layer 26 increases significantly. Although increasing the concentration of $P_2O_5$ within phosphosilicate glass layer 26 augments the etch rate in the etchant of the present invention, the increased $P_2O_5$ content also makes phosphosilicate glass layer 26 more hydroscopic. When the concentration of $P_2O_5$ exceeds approximately 8 percent, phosphosilicate glass layer 26 becomes so hydroscopic that further processing becomes difficult.

Figure 3:
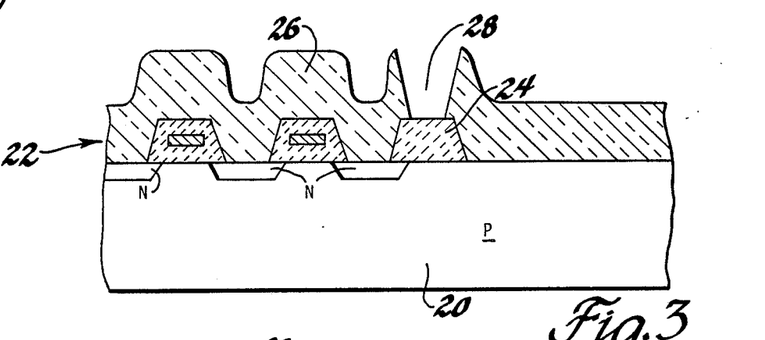

Following the formation of undensified phosphosilicate glass layer 26, a contact opening or via 28 is formed using conventional photolithographic and etching techniques. As shown in FIG. 3 of the drawings, via 28 is formed above and extends through phosphosilicate glass layer 26 to pedestal 24. Via 28 provides access for a subsequent layer 30 (FIG. 4), which is shown in this embodiment as a layer of polysilicon. The dimensions of via 28 are not critical to the invention. However, via 28 at pedestal 24 should be of sufficient size to expose adequate surface area for layer 30 to be rigidly attached to pedestal 24. Polysilicon layer 30 is then formed overlying phosphosilicate glass layer 26 by a blanket deposition of polysilicon at a temperature of less than about 625° C. One technique that can be used to deposit is to deposit the polysilicon from an atmosphere of 100 percent silane ($SiH_4$) at a pressure of 360 mili torr at a temperature of about 620° C. by chemical vapor deposition. Deposition is continued until a blanket layer about 1.0 $\mu$m thick is obtained. Such a deposition will only take about 1½ hours. This is not nearly enough at this temperature to have a significant densifying effect on the phosphosilicate glass layer 26. Any other technique that will produce a blanket polysilicon layer without densifying the phosphosilicate layer can be used, as, for example, plasma enhanced decomposition of silane ($SiH_4$) and electron beam evaporation of silicon and magnetron sputtering of silicon.

Figure 4:
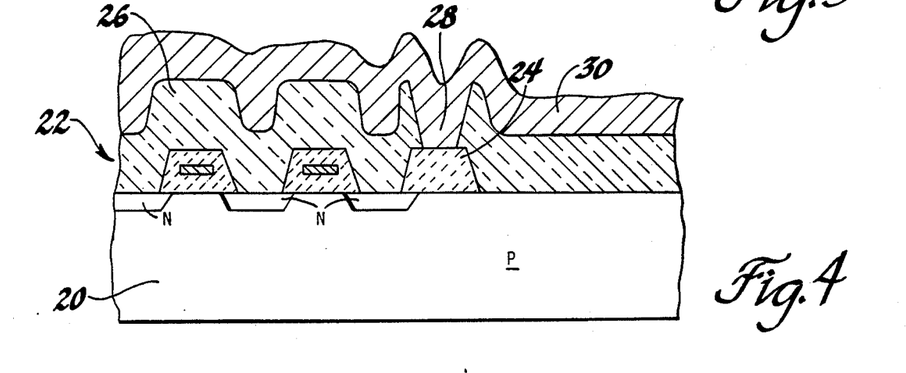

Once deposited, the blanket polysilicon layer will cover the undensified phosphosilicate layer 26 and extend through via 28 to pedestal 24 as shown in FIG. 4.

Although polysilicon works well in forming layer 30, it may be suitable and desirable in some applications to form layer 30 of metal, such as aluminum, gold, tungsten or molybdenum, or possibly a silicide or polycide, or combinations thereof. In such instance, the metal can be deposited by chemical vapor deposition or evaporation. As indicated above, any suitable technique that does not concurrently densify the phosphosilicate glass layer 26 can be used. Other materials may be used in forming layer 30, and those materials which have sufficient strength to deflect without fracturing and which resist substantial etching in the etchant of the present invention are most appropriate for use herein. It is also to be understood that materials which are suitable for forming layer 30 must also adhere well to pedestal 24 or directly to substrate 20 in some devices.

Figure 5:
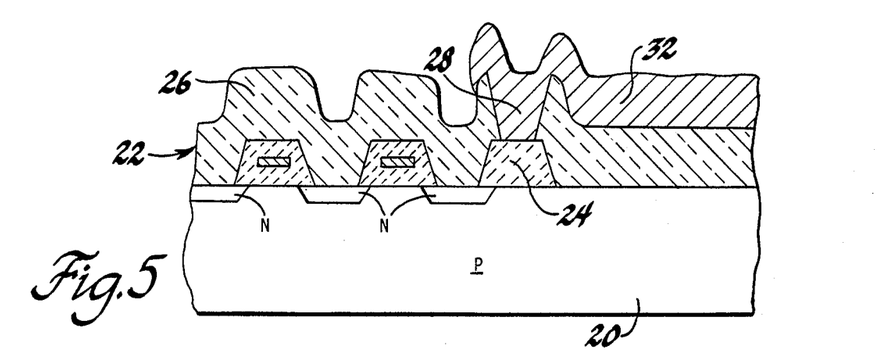

Once formed, layer 30 is patterned to form the desired micromechanical structure, illustrated in FIG. 5 as a cantilever plate or beam 32. Beam 32 is formed using a patterning technique which is compatible with the material from which layer 30 is formed. Cantilever beam 32 is shown attached to pedestal 24 through via 28 and, in this intermediate state of fabrication, beam 32 is wholly supported by underlying undensified phosphosilicate glass layer 26. It may be desirable in some applications to form an array of cantilever beams 32 or to form micromechanical structures of other configurations, such as trestles or trampoline-like structures. These alternative arrangements can be formed simply by forming multiple pedestals and vias.

The shape of beam 32 is dictated in part by the topography of the layer on which it is disposed, e.g., undensified phosphosilicate glass layer 26. By forming the undensified phosphosilicate glass layer 26 using a spin-coating technique, its top or principal surface is essentially even, lacking dips or valleys which may be present in underlying layers. Hence, when layer 30 is formed, a non-conformal beam (not shown) can be fabricated. Alternatively, a conformal beam 32 can be fabricated, as shown in FIG. 5, by forming the undensified phosphosilicate glass layer 26 by chemical vapor deposition wherein phosphosilicate glass layer 26 assumes the topography of underlying layers.

After cantilever beam 32 has been formed, undensified phosphosilicate glass layer 26 is entirely removed from the surface of substrate 20, or at least from those relevant portions of that surface as are shown in the drawing. Removal is obtained by applying our preferential etchant to the layered substrate. The preferred etchant solution which is used herein to selectively etch undensified phosphosilicate layer 26 contains, in parts per volume, about one part of an aqueous ammonium hydroxide solution ($NH_4OH$), about one part of an aqueous hydrogen peroxide solution $H_2O_2$), and from about 2.5 parts to about 4 parts water. The aqueous ammonium hydroxide solution used herein to prepare the etchant solution contains from about 28 to about 30 percent $HN_3$ by weight. The aqueous hydrogen peroxide solution contains about 30 percent $H_2O_2$ by weight. The most preferred etchant solution contains one part aqueous ammonium hydroxide solution, one part aqueous hydrogen peroxide solution and three parts water. This corresponds to an actual initial aqueous composition containing about 3.25 mole percent hydrogen peroxide and about 6.5 mole percent ammonium hydroxide. This preferred initial concentration can be increased or decreased by at least 50 percent when used under the conditions used herein. It may be possible to vary This preferred concentration even more if the principles of the present invention are followed. In these proportions, the etchant solution etches undensified phosphosilicate glass layer 26 about 100 to 1,000 times faster than it etches silicon, silicon dioxide, or polysilicon. In fact, it etches undensified phosphosilicate glass about 30 to 50 times faster than densified phosphosilicate glass.

Our etchant can be applied to the device illustrated in FIG. 5 in any convenient manner, as, for example, immersing substrate 20 and its overlying layers in our etchant, spraying our etchant onto the layered substrate surface, or the like. However, we prefer that the device of FIG. 5 be immersed in the etchant solution by means of a reflux apparatus, to minimize evaporative etchant losses.

An important feature of this invention that should not be overlooked is that our etchant will attack undensified phosphosilicate glass at a rapid rate even at temperatures significantly below boiling point temperatures. For example, at a temperature of about 80° C., our etchant will remove undensified phosphosilicate glass at a rate of about 0.04 micrometers to 0.08 micrometers of thickness per minute. Due to this high etching rate at about 80° C., the temperature of the etchant solution does not need to be heated to a higher temperature during use. Heating to any appreciably higher temperature would put the etchant at or near boiling temperatures. It is known that ammonium hydroxide and hydrogen peroxide tend to decompose in aqueous solutions as the solution temperature increases. This decomposition (and attendant evaporation) increases slowly up to about 80° C. However, above about 80° C., these losses accelerate dramatically. These losses are so severe that we believe almost all hydrogen peroxide/ammonium hydroxide solutions will end up at about the same low concentration after only about an hour at boiling or near boiling temperatures, unless they are replenished, of course.

On the other hand, at the etchant boiling point, replenishing them at the correct rate is not an easy task. In fact, at these temperatures it appears to us that it is so difficult to maintain an effective constituent concentration and ratio by replenishment as to be impractical. As solution temperatures are reduced, the replenishment problems decrease. At 90° C., a somewhat higher etching rate (than that attained by etching at 80° C.) could be expected. However, replenishment and etching control can still be quite a problem. Accordingly, we prefer to use an etching temperature of about 80° C., where etching rate is satisfactory and etching control can be better maintained. It should also be mentioned that our etchant could be used at lower temperatures, too. However, as might be expected from the foregoing, the etching rate would decrease. On the plus side, decomposition losses decrease, too, but we do not believe that they are reduced enough to offset the slower etching rate.

As mentioned above, the composition of the etchant solution does not remain constant throughout the etching process. In addition, the constituents do not decompose at the same rate. Hence, ratio of constituents changes, as well as concentration. Accordingly, it is preferred that the etchant solution be freshly prepared at room temperature to minimize thermal decomposition of the solution components. Etching should be commenced immediately after the etchant reaches about 80° C. It should also be noted that additives which inhibit thermal decomposition of hydrogen peroxide are known. These inhibitors may be useful in the present invention to reduce the preferred initial concentration of hydrogen peroxide or to reduce the frequency or amount of hydrogen peroxide which may be added to the etchant solution during etching. From the above, it can be seen that etch rate is principally determined by whether or not the phosphosilicate glass has been densified or not. However, etch rate also is affected by the glass composition, the etchant composition, and the etching temperature. Depending on the thickness of the phosphosilicate glass layer 26, which will usually be in the range of about 0.5 micrometers to 2 micrometers, the removal of the entire thickness of undensified phosphosilicate glass layer 26 in our etchant solution usually requires several minutes to several hours. As stated, the etchant solution of the present invention removes undensified phosphosilicate glass layer 26 at least two to three orders of magnitude faster than silicon, silicon dioxide, and polysilicon. Hence, substrate 20, detection circuitry 22, and pedestal 24 are not substantially affected by the etchant. The device remains in the etchant bath until substantially all of the thickness of the undensified phosphosilicate glass layer 26 has been removed.

Figure 6:
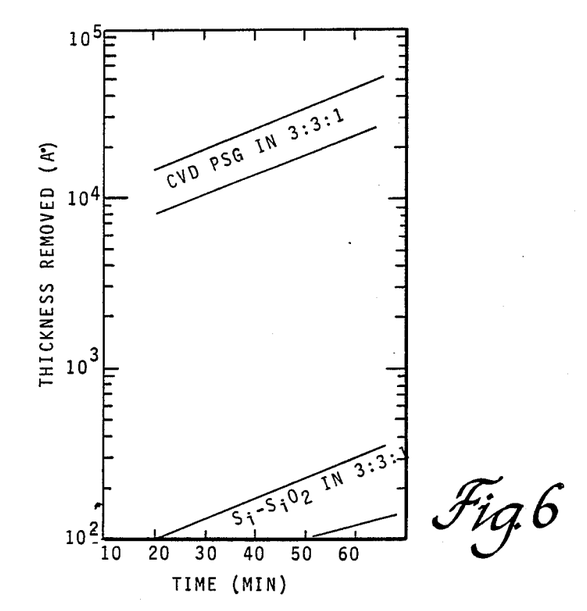
FIG. 6 is a graph illustrating the relative etch rates of various materials etched in accordance with the present invention.
Figure 7:
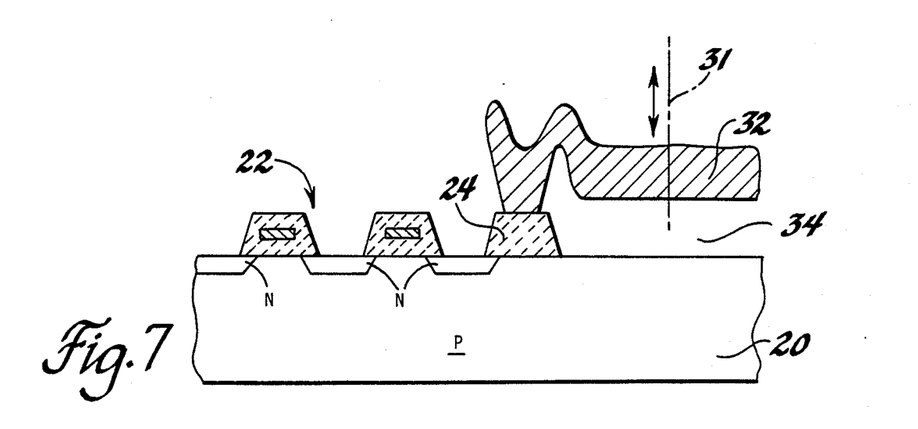

FIG. 6 illustrates the etch rate of an undensified phosphosilicate glass layer that was formed on a monocrystalline substrate by chemical vapor deposition of silane and oxygen and phosphine at a pressure of about 760 mili torr and a temperature of about 380° C. for a period of about 0.2 hours. This deposition resulted in an undensified phosphosilicate layer about 1.2 micrometers thick that contained approximately 6.0 percent by weight phosphorus pentoxide. It was etched in an etchant consisting of one part hydrogen peroxide, one part ammonium hydroxide and three parts water. The etching was done in a reflux apparatus at about 80° C. The undensified phosphosilicate glass etched at a rate of about 100,000 angstroms per hour. By comparison, the same etchant bath etches silicon and silicon dioxide at a rate of only about 100 angstroms per hour. Therefore, undensified phosphosilicate glass layer 26 is etched three orders of magnitude faster than silicon or silicon dioxide, providing an extremely accurate preferential etching method. As shown in FIG. 7, after the entire thickness of undensified phosphosilicate glass layer 26 is etched away, cantilever beam 32 extends laterally from its attachment to pedestal 24 across substrate 20 from which it is spaced apart by air gap 34. Air gap 34 may serve as the dielectric of a variable capacitor having cantilever beam 32, and substrate 20 as capacitor plates.

Finally, the appropriate metallization (not shown) is applied and patterned to interconnect cantilever beam 32, detection circuitry 22, and substrate 20. In operation, accelerations normal to the principal surface of cantilever beam 32, i.e., along the axis designated by the numeral 31, cause cantilever beam 32 to deflect toward silicon substrate 20, which reduces the thickness of air gap 34, resulting in a change in capacitance. As will be explained more fully, detection circuitry 22 detects these extremely small changes in capacitance, which can then be related to the force acting on cantilever beam 32.

Figure 8:
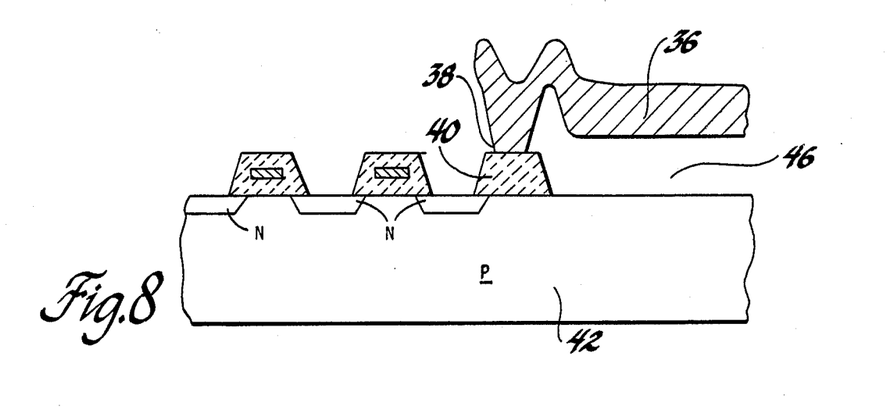
FIGS. 8 through 13 show cross-sectional views of an alternate device in intermediate fabrication stages made in accordance with this invention.
Figure 9:
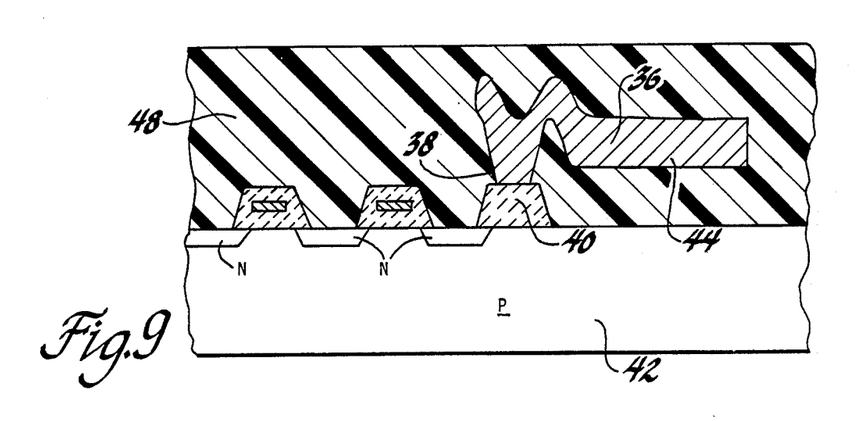
Figure 10:
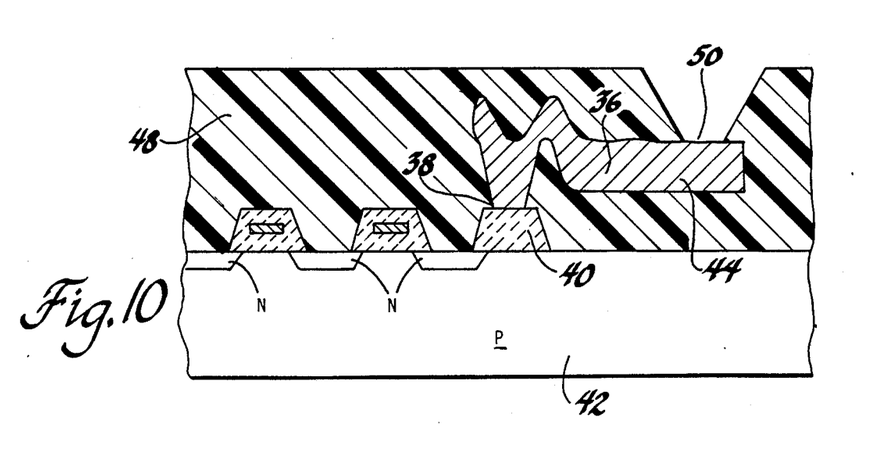

In another aspect, the present invention provides a method by which a cantilever structure can be loaded with a mass to attain a preselected sensitivity and response and in a manner such that the center of gravity of the cantilevered structure is located at the end point of the free end of the beam. Referring now to FIG. 8 of the drawings, cantilever beam 36 is formed having one end 38 secured to pedestal 40 which, in turn, is attached to substrate 42. Cantilever beam 36 extends longitudinally across substrate 42, terminating at free end 44. Cantilever beam 36 is spaced apart from substrate 42 by intervening air gap 46. Next, as shown in FIG. 9, cantilever beam 36 is encased in a layer of photoresist 48, which also overlies pedestal 40 and substrate 42. Photoresist layer 48 fills air gap 46 supporting cantilever beam 36. Many positive and negative photoresists are available which are suitable for use in forming photoresist layer 48 and which are well known to those skilled in the art. Photoresist layer 48 is then patterned to form contact opening or via 50 above and extending through to cantilever beam 36, as shown in FIG. 10. The position of via 50 is dictated by a number of factors, including the length and weight of cantilever beam 36 and the weight of the mass to be formed thereon.

Following the formation of via 50 in photoresist layer 48, photoresist layer 50 is blanket exposed in ultraviolet light and then further hardened by exposure to a CF$_4$ plasma for approximately one minute. Next, photoresist layer 48 and the underlying device are baked at about 150° C. for approximately one hour. Photoresist layer 48 is further hardened by implanting it with 80 keV at $1.0 \times 10^{15}$ silicon ions cm$^{-2}$. At this stage, photoresist layer 48 is still essentially hydrophobic. In order to improve the adhesion of a subsequent metal or silicide layer, the entire surface topography of photoresist layer 48 is made hydrophilic by exposing photoresist layer 48 to an oxygen plasma for approximately 30 seconds.

Figure 11:
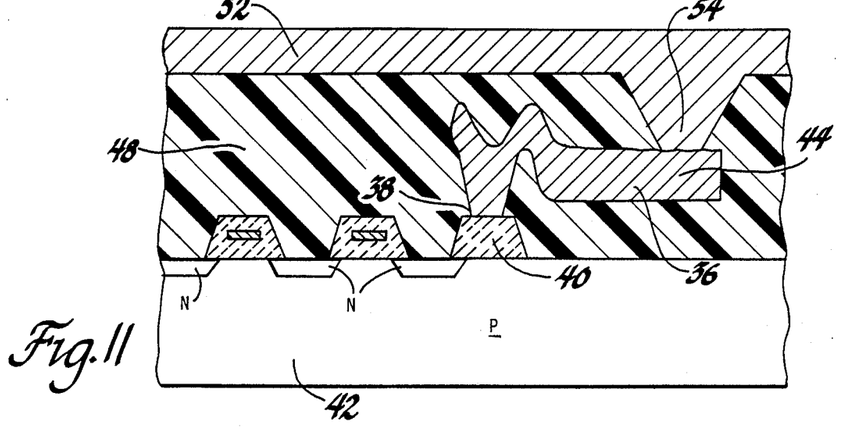
Figure 12:
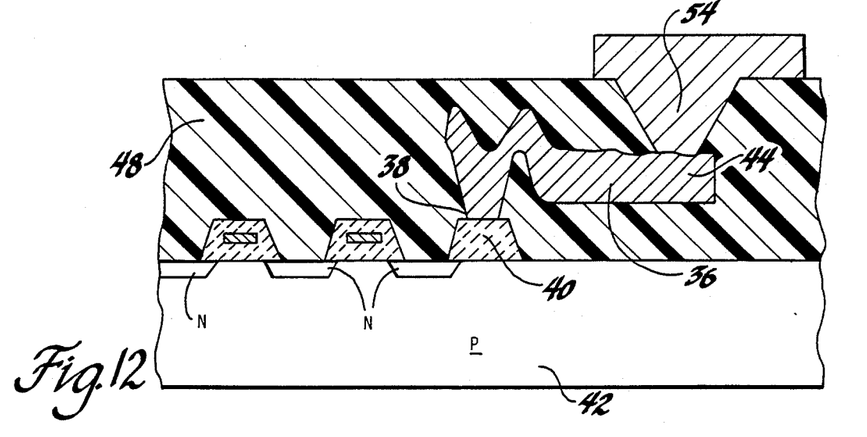
Figure 13:
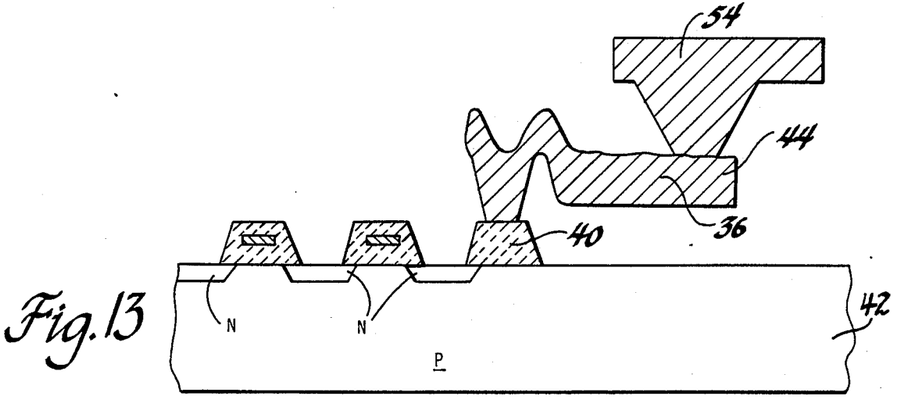

Referring now to FIG. 11, a layer of metal 52, such as aluminum, is formed over photoresist layer 48 and extends through via 50 to make rigid contact to cantilever beam 36. As with cantilever beam 36, layer 52 can be formed of polysilicon, aluminum, gold tungsten, molybdenum, silicide, polycide and combinations thereof. In addition, it should be understood that gold would be preferred because of its high mass. However, aluminum might be preferred because of convenience it provides in allowing use of existing deposition and etching steps of an existing manufacturing process. After deposition, layer 52 is patterned to form mass 54 which, as shown in FIG. 12, extends beyond free end 44 of cantilever beam 36. Next, photoresist layer 48 is substantially completely removed in an oxygen plasma. As shown in FIG. 13, the resulting structure includes cantilever beam 36 to which mass 54 is attached. By forming mass 54 such that it overhangs free end 44 of cantilever beam 36, the center of gravity of cantilever beam 38 can be located precisely at the end point 56 of free end 44. This configuration eliminates the negative bending moment associated with a cantilever beam which does not have the overhanging mass of the present invention. This method for attaching a mass to a cantilevered structure can be used to place the center of gravity of the beam at any desired, predetermined location.

According to another aspect of the present invention, a method is provided for detecting extremely small motions of a cantilevered or other micromechanical structure. In order for the micromechanical structures fabricated in accordance with the present invention to operate as transducing elements in accelerometers and vibration sensors, extremely small beam deflections must be detected by the detection circuitry. As stated, accelerations normal to the principal surface of the beam cause the beam to deflect due to its inertial mass. These beam motions produce a capacitance variation, but the magnitude of the capacitance signal is generally only a few femtofarads. The present invention provides a method for detecting these extremely small beam movements and provides a digital output which can be processed easily by a microprocessor or other digital logic.

In the method of the present invention, the micromechanical structure and the underlying substrate form a variable capacitor and a high frequency oscillator, as shown in FIG. 14, which schematically illustrates an oscillator 56 whose frequency is modulated by a variable capacitor 58. An enable signal starts or stops the oscillator 56. Movement of the cantilevered structure causes a change in capacitance in the variable capacitor 58 which is used to change the frequency of oscillation of the circuit. A capacitance change of only a few femtofarads will change the frequency of oscillation. Extremely small changes in the frequency of oscillation are detected in the following manner. The change in frequency of oscillation of the circuit is fed into a high performance counter 60 which is clocked by a high frequency reference clock, as shown in FIG. 15. By enabling the counter 60 for a long time period compared to the period of the oscillator output, a very small change in frequency can be translated into a different count produced by the counter 60. Since the oscillator produces a digital output which is fed into a digital counter, the final count can be used directly by digital signal processing or other logic circuitry without first converting it from an analog signal to a digital signal. As is known, analog to digital converters often introduce noise and errors into the signal.

In a micromechanical variable capacitor having a beam with a 30×50 micron plate and having a sensitivity of about 0.5 microns/g, where the on-board detection circuitry includes an oscillator designed in 5 micron NMOS technology using easy-to-process circuit parameters, FIG. 16 shows the response of the oscillator for 1g accelerations. The data in FIG. 16 was produced using a circuit simulator to simulate an accelerometer having the foregoing specifications. Each set of plots gives voltages at three nodes of the oscillator circuit. The signal designated by the letter f was assumed to be the input to the counter. The simulation is performed for 100 nanoseconds. The change in frequency of oscillation was detectable even within this short time period. The frequency of the oscillator with the beam simulated at rest was about 57.4 MHz and the frequency for simulated 1g of acceleration in the positive and negative directions was, respectively, 58.5 MHz and 55.0 MHz. These differences were translated to count differences of over one million over a period of a second. By enabling the oscillator for about 10 milliseconds, which is a relatively short time period for mechanical changes of micromechanical devices, accelerations of less than 0.001g could be detected as a change in the count value over 10.

Since a cantilever beam is more sensitive to accelerations in one direction, it may be possible to fabricate an accelerometer or vibration sensor having an array of beams to detect different components of acceleration. Furthermore, it may be possible to fabricate accelerometers and vibration sensors which compensate for temperature differences.

The embodiments of the invention in which an exclusive property or privilege is claimed are defined as follows:

1. A method of etching undensified phosphosilicate glass comprising the step of contacting said phosphosilicate glass with an aqueous ammoniacal hydrogen peroxide solution containing from about 4 mole percent to about 8 mole percent ammonium hydroxide and from about 0.5 mole percent to about 4 mole percent hydrogen peroxide in aqueous solution, in an ammonium hydroxide, hydrogen peroxide and water ratio that is generally equivalent to about 1:1:2.5 to 1:1:4, respectively, of an aqueous ammonium hydroxide solution containing 28–30 percent $NH_3$ by weight, of an aqueous hydrogen peroxide solution containing 30 percent $H_2O_2$ by weight, and of water.

2. A method of etching completely away a first layer of an undensified phosphosilicate glass overlying a second layer of material without substantially etching said second layer, wherein said second layer includes silicon, silicon dioxide, or polysilicon, said method comprising the step of:

immersing said first and second layers in an aqueous ammoniacal hydrogen peroxide solution containing an ammonium hydroxide concentration equal to that provided by about one part by volume of an aqueous $NH_4OH$ solution having from about 28 percent to 30 percent $NH_3$ by weight, about one part by volume of an aqueous $H_2O_2$ solution having about 30 percent $H_2O_2$ by weight, and from about 2.5 parts to about 4.0 parts by volume $H_2O$.

3. A method for fabricating three-dimensional microstructures, comprising the steps of:

(a) forming a layer of phosphosilicate glass on a substrate;

(b) forming at least one via through said phosphosilicate glass layer to expose a portion of said substrate;

(c) forming a micromechanical structure overlying said phosphosilicate glass layer, a portion of said micromechanical structure extending through said via and attached to said substrate; and (d) removing said phosphosilicate glass layer while it is still in its as-deposited state with an aqueous ammoniacal hydrogen peroxide solution containing an ammonium hydroxide concentration equal to that provided by about one part by volume of an aqueous $NH_4OH$ solution having from about 28 percent to 30 percent $NH_3$ by weight, about one part by volume of an aqueous $H_2O_2$ solution having about 30 percent $H_2O_2$ by weight, and from about 2.5 parts to about 4.0 parts by volume $H_2O$, whereby said phosphosilicate glass layer is substantially completely etched away to form an air gap between said micromechanical structure and said substrate.

4. A method for making a vibration sensor having a vibration detection circuit and at least one micromechanical transducing element integrated in a single semiconductor body, comprising the steps of:

(a) forming on said semiconductor body a plurality of circuit elements which can be connected to form said detection circuit;

(b) depositing a layer of phosphosilicate glass by spin coating onto said silicon body, where it overlies said circuit elements to form a glass layer having a high etch rate in the etchant hereinafter described;

(c) forming at least one via in said phosphosilicate glass layer while it still has said high etch rate, to expose a portion of said semiconductor body;

(d) forming a micromechanical structure on said high etch rate phosphosilicate glass layer without significantly reducing said high etch rate, said micromechanical structure extending through said via and adhering to said exposed portion of said semiconductor body;

(e) immersing said semiconductor body having said circuit elements, said high etch rate phosphosilicate glass layer and said micromechanical structure formed thereon in an aqueous ammoniacal hydrogen peroxide solution to remove said high etch rate phosphosilicate glass layer without substantially etching said circuit elements, wherein said solution is an aqueous solution containing from about 4 mole percent to about 8 mole percent ammonium hydroxide and from about 0.5 mole percent to about 4 mole percent hydrogen peroxide; and (f) applying a metallization layer over said semiconductor body to interconnect said circuit elements, said micromechanical structure, and said semiconductor body, wherein said micromechanical structure and said semiconductor body define an air gap variable capacitor.

* * * * *